(12) United States Patent
Liu et al.

(10) Patent No.: US 10,971,622 B2
(45) Date of Patent: Apr. 6, 2021

(54) TRANSISTOR STRUCTURES

(71) Applicant: Avago Technologies International Sales Pte. Limited, Singapore (SG)

(72) Inventors: Qing Liu, Irvine, CA (US); Akira Ito, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 370 days.

(21) Appl. No.: 16/153,239

(22) Filed: Oct. 5, 2018

(65) Prior Publication Data
US 2020/0111905 A1  Apr. 9, 2020

(51) Int. Cl.
| | | |
|---|---|---|
| H01L 29/78 | (2006.01) | |
| H01L 23/528 | (2006.01) | |
| H01L 29/66 | (2006.01) | |
| H01L 29/40 | (2006.01) | |

(52) U.S. Cl.
CPC ........ *H01L 29/7817* (2013.01); *H01L 23/528* (2013.01); *H01L 29/407* (2013.01); *H01L 29/66681* (2013.01); *H01L 29/785* (2013.01)

(58) Field of Classification Search
CPC .............. H01L 29/7817; H01L 23/528; H01L 29/66681; H01L 29/407; H01L 29/785; H01L 29/402; H01L 29/7823; H01L 29/7824; H01L 29/0623; H01L 29/7825; H01L 29/4236; H01L 29/66704
See application file for complete search history.

(56) References Cited

U.S. PATENT DOCUMENTS

| | | | | |
|---|---|---|---|---|
| 2018/0108755 A1* | 4/2018 | Liu | ...................... | H01L 29/7835 |
| 2018/0308841 A1* | 10/2018 | Liu | ...................... | H01L 27/0886 |
| 2019/0131402 A1* | 5/2019 | Liu | ...................... | H01L 29/0653 |

* cited by examiner

*Primary Examiner* — Laura M Menz
*Assistant Examiner* — Pavel G. Ivanov
(74) *Attorney, Agent, or Firm* — Morgan, Lewis & Bockius LLP

(57) ABSTRACT

A transistor structure includes a substrate and a fin structure on the substrate. The fin structure includes an undoped portion, a first doped portion, and a second doped portion. The transistor structure includes an electrode on the fin structure between the first doped portion and the second doped portion, and an insulating layer on the fin structure. The transistor structure includes a first trench in the insulating layer at a first side of the fin structure and between the electrode and the second doped portion, and a second trench in the insulating layer at a second side of the fin structure and between the electrode and the second doped portion. The first trench includes a first conductive material, and the second trench includes a second conductive material.

20 Claims, 4 Drawing Sheets

TRANSISTOR STRUCTURES

FIELD OF THE DISCLOSURE

Example embodiments are generally directed toward transistor structures, and more particularly, to Fin field-effect transistor (FinFET) structures.

BACKGROUND

Transistors have a wide variety of applications in electronics. In applications that utilize power amplifiers, laterally diffused metal-oxide-semiconductor (LDMOS) transistor configurations may be employed with FinFET structures. Conventional LDMOS transistors have limits with respect to minimum on-resistance, maximum drive current, and/or reliability characteristics.

BRIEF DESCRIPTION OF THE DRAWINGS

Inventive concepts are described in conjunction with the appended figures, which are not necessarily drawn to scale.

DETAILED DESCRIPTION

Figure 1:
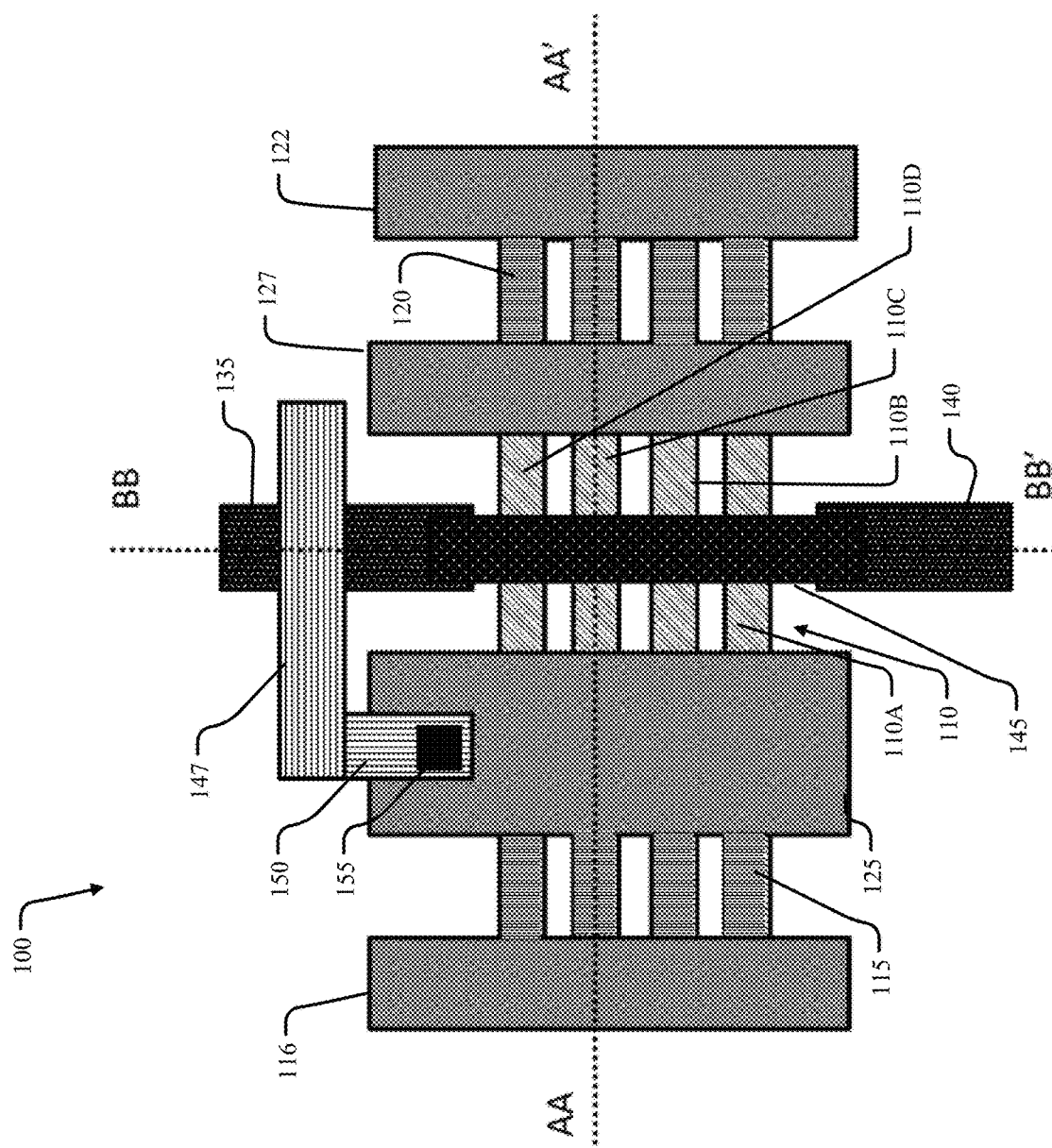
FIG. 1 illustrates a transistor structure according to at least one example embodiment.

At least one example embodiment relates to an LDMOS-based transistor that allows for dynamic tuning of the on-resistance of the transistor while simultaneously improving the drive current and maintaining reliability. For example, a deep metal trench is inserted into a shallow trench isolation (STI) region along the current path of the transistor, which assists with the accumulation of carriers in the current path when a voltage is applied to the metal trench.

The ensuing description provides example embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 2:
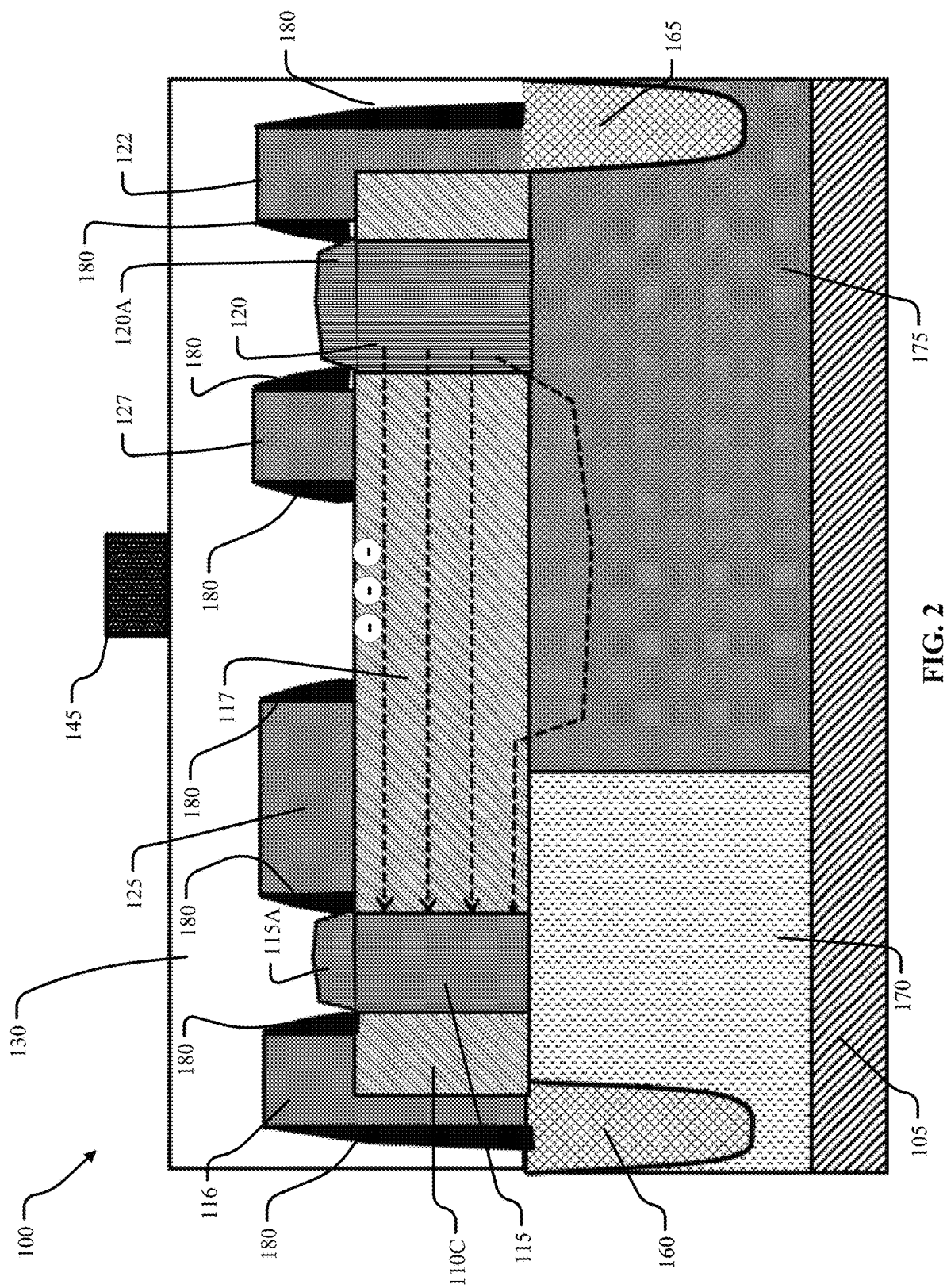
FIG. 2 illustrates a cross-sectional view of the transistor structure along line AA-AA' in FIG. 1 according to at least one example embodiment.
Figure 3:
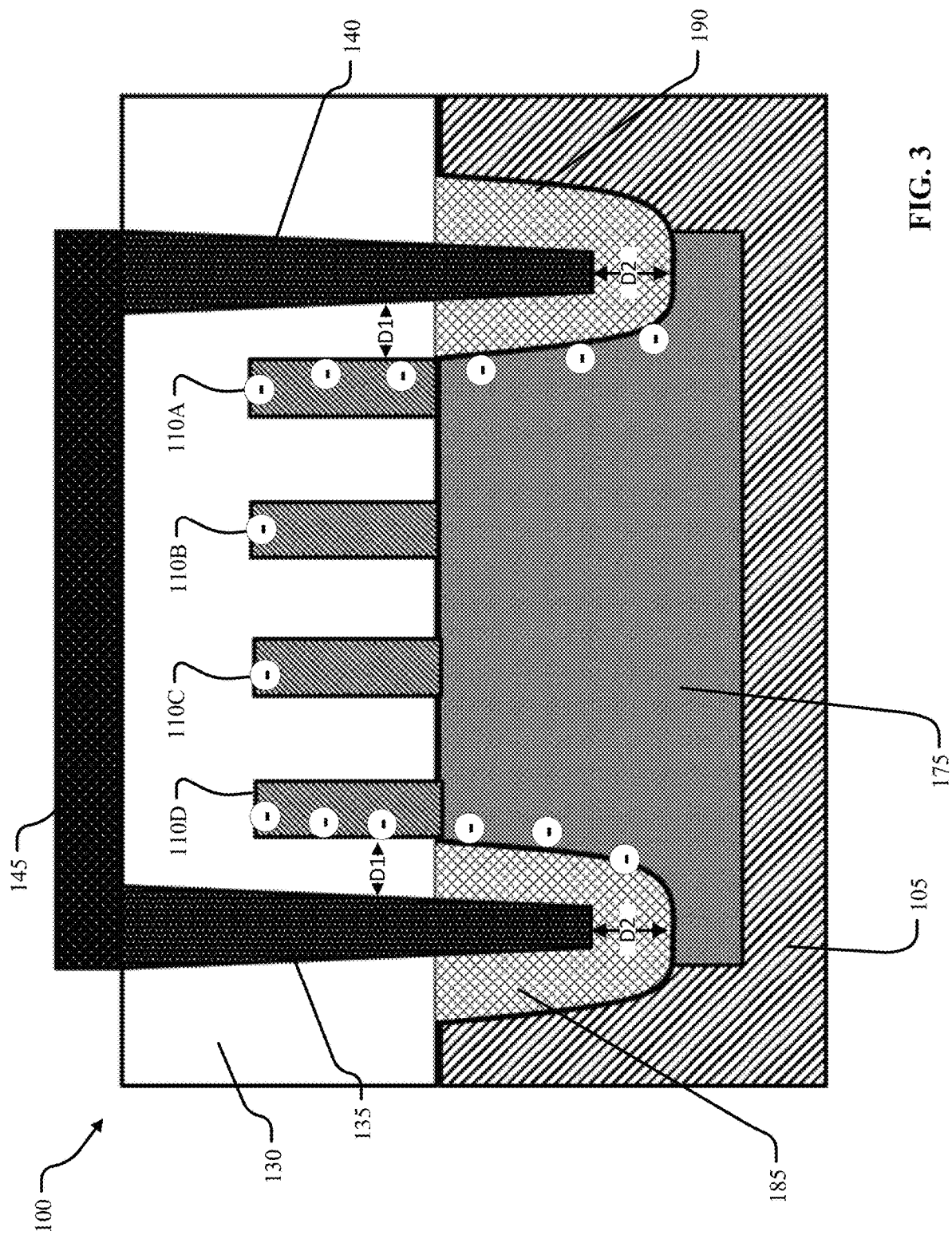
FIG. 3 illustrates a cross-sectional view of the transistor structure along line BB-BB' in FIG. 1 according to at least one example embodiment.

FIG. 1 illustrates a transistor structure 100 according to at least one example embodiment. FIG. 2 illustrates a cross-sectional view of the transistor structure 100 along line AA-AA' in FIG. 1. FIG. 3 illustrates a cross-sectional view of the transistor structure 100 along line BB-BB' in FIG. 1. Here, it should be appreciated that various elements of the transistor structure 100 may be omitted from the various views of the figures for the convenience of illustration. For example, FIG. 1 does not show elements of the substrate 105 to avoid confusion with other elements of the transistor structure 100.

With reference to FIGS. 1-3, the transistor structure 100 includes a substrate 105 and a fin structure 110 on the substrate 105. For example, the fin structure 110 comprises an epitaxial structure having a linear shape. In at least one example embodiment, the fin structure 110 comprises a plurality of fins 110A-110D. The fins 110A-110D may comprise epitaxially grown semiconductor material, such as silicon. Each fin 110A-110D may include a portion (e.g., an undoped portion) 117, a first doped portion (or source or source region) 115, and a second doped portion (or drain or drain region) 120. As shown in FIG. 2, the second doped portion 120 is separated from the first doped portion 115 by the undoped portion 117. The first and second doped portions 115 and 120 may be highly-doped regions doped with a p-type impurity or an n-type impurity (e.g., $1E19~1E20/cm^3$), a decision made according to design preferences. As shown in FIG. 2, the first doped portion 115 and the second doped portion 120 each include a raised portion 115A and 120A on the fin structure 110. Although four fins 110A-110D are illustrated in FIGS. 1-3, it should be understood that more or fewer fins may be included depending on design preferences.

The transistor structure 100 further includes an electrode (or gate electrode) 125 on the fin structure 110 between the first doped portion 115 and the second doped portion 120. As shown in FIGS. 1 and 2, the electrode 125 is closer to the first doped portion 115 than the second doped portion 120. As also shown, the electrode 125 may be on the undoped portion 117 of the fin structure 110.

The transistor structure 100 may further include electrodes 116, 122, and 127. The electrode 116 may be a source electrode for the source 115 and the electrode 122 may be a drain electrode for the drain 120. The electrode 127 may be a dummy electrode on the fin structure 110 and between the electrode 125 and the drain 120. Each of the electrodes 116, 122, 125, and 127 may include a metal, such as copper, tungsten, or the like, and may include respective insulative spacers 180 formed on both sides of each electrode 116, 122, 125, and 127. The spacers 180 may include an insulation material, such as oxide.

As shown in FIG. 2, the substrate 105 may include well regions 170 and 175. In at least one example embodiment, the well region 170 is a p-well region and the well region 175 is an n-well region. However, example embodiments are not limited thereto and the conductivity type of the regions 170 and 175 may vary according to design preferences. The substrate 105 may further include isolation regions (e.g., STI regions) 160 and 165 to isolate the transistor structure 100 from surrounding structures (not shown).

The transistor structure 100 further includes an insulating layer 130 on the fin structure 110 and the electrode 125. The insulating layer 130 may include an insulating material, such as an oxide.

As shown in FIGS. 1 and 3, the transistor structure 100 includes a first trench 135 in the insulating layer 130 at a first side of the fin structure 110 and between the electrode 125 and the second doped portion 120. The first trench 135 includes a first conductive material. The transistor structure 100 further includes a second trench 140 in the insulating layer 130 at a second side of the fin structure 110 and between the electrode 125 and the second doped portion 120. The second side of the fin structure 110 is opposite the first side, and the second trench 140 includes a second conductive material. In embodiments where the fin structure 110 is a plurality of fins 110A-110D including a first outer fin 110D and a second outer fin 110A, the first trench 135 is at an outer side of the first outer fin 110D, and the second trench 140 is at an outer side of the second outer fin 110A.

According to at least one example embodiment, the first conductive material in the first trench 135 and the second conductive material in the second trench 140 are electrically connected to the electrode 125. For example, the transistor structure 100 includes a first conductive layer (or wiring or metal wiring) 145 (e.g., on the insulating layer 130) to electrically connect the first conductive material to the second conductive material. In at least one example embodiment, the transistor structure 100 includes at least one second conductive layer electrically connecting the electrode 125 to the first conductive layer 145. For example, the at least one second conductive layer may include wirings 147, 150, and/or 155 that electrically connect the electrode 125 to the conductive material in the trench 135.

Example embodiments are not limited to cases that include the conductive layer 145. For example, the conductive layer 145 may be omitted if desired. In this case, the first and second conductive materials in the trenches 135/140 may be electrically connected to the electrode 125 by some other means, for example, by respective wirings that electrically connect a respective conductive material to a respective end of the electrode 125. For example, the wirings 147, 150, and 155 shown as connecting the conductive material in the trench 125 may be reproduced (and mirrored) to electrically connect the conductive material in the trench 140 to an end of the electrode 125.

In at least one example embodiment, the first conductive material in the trench 135, the second conductive material in the trench 140, the first conductive layer 145, and the at least one second conductive layer include metal, such as copper, tungsten, or the like.

As shown in FIG. 3, the substrate 105 may further comprise a first isolation region 185 and a second isolation region 190. The first and second isolation regions 185/190 may be STI regions. In at least one example embodiment, the first trench 135 penetrates the first isolation region 185, and the second trench 140 penetrates the second isolation region 190.

As shown in FIG. 3, the first trench 135 and the second trench 140 include portions that are a distance D1 from the fins 110D and 110A. According to at least one example embodiment, the distance D1 is about 30 nm. As also shown, the first trench 135 and the second trench 140 include portions at a distance D2 from a bottom of the STI regions 185 and 190. According to at least one example embodiment, the distance D2 is about 50 nm. Here, it should be understood that the distances D1 and D2 may vary from the aforementioned values according to design preferences (e.g., according to a desired influence of the conductive material in the trenches 135/140 on the current path of the transistor structure 100).

In view of the above, it should be appreciated that at least one example embodiment is directed to a FinFET 100 including a substrate 105 and a fin structure 110 on the substrate 105 and including a source 115, a drain 120, and a portion 117 that separates the source 115 from the drain 120. The FinFET 100 includes a gate electrode 125 on the fin structure 110 and between the source 115 and the drain 120. The FinFET 100 includes an insulating layer 130 on the fin structure 110 and the gate electrode 125. The FinFET 100 includes a first trench 135 in the insulating layer 130 at a first side of the fin structure 110 and between the gate electrode 125 and the drain 120. The first trench 135 includes a first metal. The FinFET 100 includes a second trench 140 in the insulating layer 130 at a second side of the fin structure 110 and between the gate electrode 125 and the drain 120. The second side is opposite the first side, and the second trench 140 includes a second metal.

The FinFET 100 further includes a metal wiring 145 on the insulating layer 130. The metal wiring 145 electrically connects the first metal in the first trench 135 to the second metal in the second trench 140. As shown in FIG. 1, the fin structure 110 extends in a first direction, and the metal wiring 145 extends in a second direction that is perpendicular to the first direction. In a case where the fin structure 110 is a plurality of fins 110A-110D including a first outer fin 110D and a second outer fin 110A, the first trench 135 is at an outer side of the first outer fin 110D and the second trench 145 is at an outer side of the second outer fin 110A. The substrate 105 may further include a first isolation region 185 and a second isolation region 190. The first trench 135 that includes the first metal penetrates the first isolation region 185, and the second trench 140 that includes the second metal penetrates the second isolation region 190.

The FinFET 100 further comprises a dummy electrode 127 formed on the fins 110A-110D and between the gate electrode 125 and the drain 120. Here, the gate electrode 125 is closer to the source 115 than the drain 120.

In view of the above, it should be understood that at least one example embodiment is directed to a transistor 100 including a substrate 105 and at least one epitaxial structure 110 on the substrate 105. The at least one epitaxial structure 110 includes a source 115, a drain 120, and a portion 117 that separates the source 115 from the drain 120. As shown in FIG. 1, the at least one epitaxial structure 110 is linear and extends in a first direction. The transistor 100 includes a gate electrode 125 on the at least one epitaxial structure 110 and between the source 115 and the drain 120. The transistor 100 includes an insulating layer 130 on the at least one epitaxial structure 110 and the gate electrode 125. The transistor 100 includes a conductive structure electrically connected to the gate electrode 125 and that straddles the at least one epitaxial structure 110 at a location between the gate electrode 125 and the drain 120. According to at least one example embodiment, the conductive structure includes a first conductive trench 135 at a first side of the at least one epitaxial structure 110, and a second conductive trench 140 at a second side of the at least one epitaxial structure 110, where the second side is opposite the first side. In at least one example embodiment, the conductive structure further includes a conductive wiring 145 that electrically connects the first conductive trench 135 to the second conductive trench 140. The conductive wiring 145 extends in a second direction that is perpendicular to the first direction.

In operation of the transistor structure 100, a voltage may be applied to the electrode 125 to turn the transistor structure 100 on. As illustrated with the electrons in FIGS. 2 and 3, when the voltage is a positive voltage, the electrons are attracted to outer surfaces/edges of the fins 110A-110D and to the interface between the well region 175 and the isolation regions 185/190. The additional electrons in the current path of the transistor structure 100 reduces the on-resistance of the transistor structure 100 and boosts the drive current. For example, as illustrated by the dashed arrows in FIG. 2, the drive current has a wider and lower resistance path flowing from drain to source. Accordingly, example embodiments provide a transistor with low on-resistance and improved drive current while maintaining reliability. In addition, when no voltage is applied to the electrode 125, there is no impact on leakage current because the metal structures 135, 140, and/or 145 also do not have a voltage applied thereto.

Here, it should be appreciated that FIGS. 1-3 illustrate an N-LDMOS structure. However, example embodiments are not limited thereto and may be applied to other structures such as P-LDMOS structures, other FinFET transistors, etc.

Figure 4:
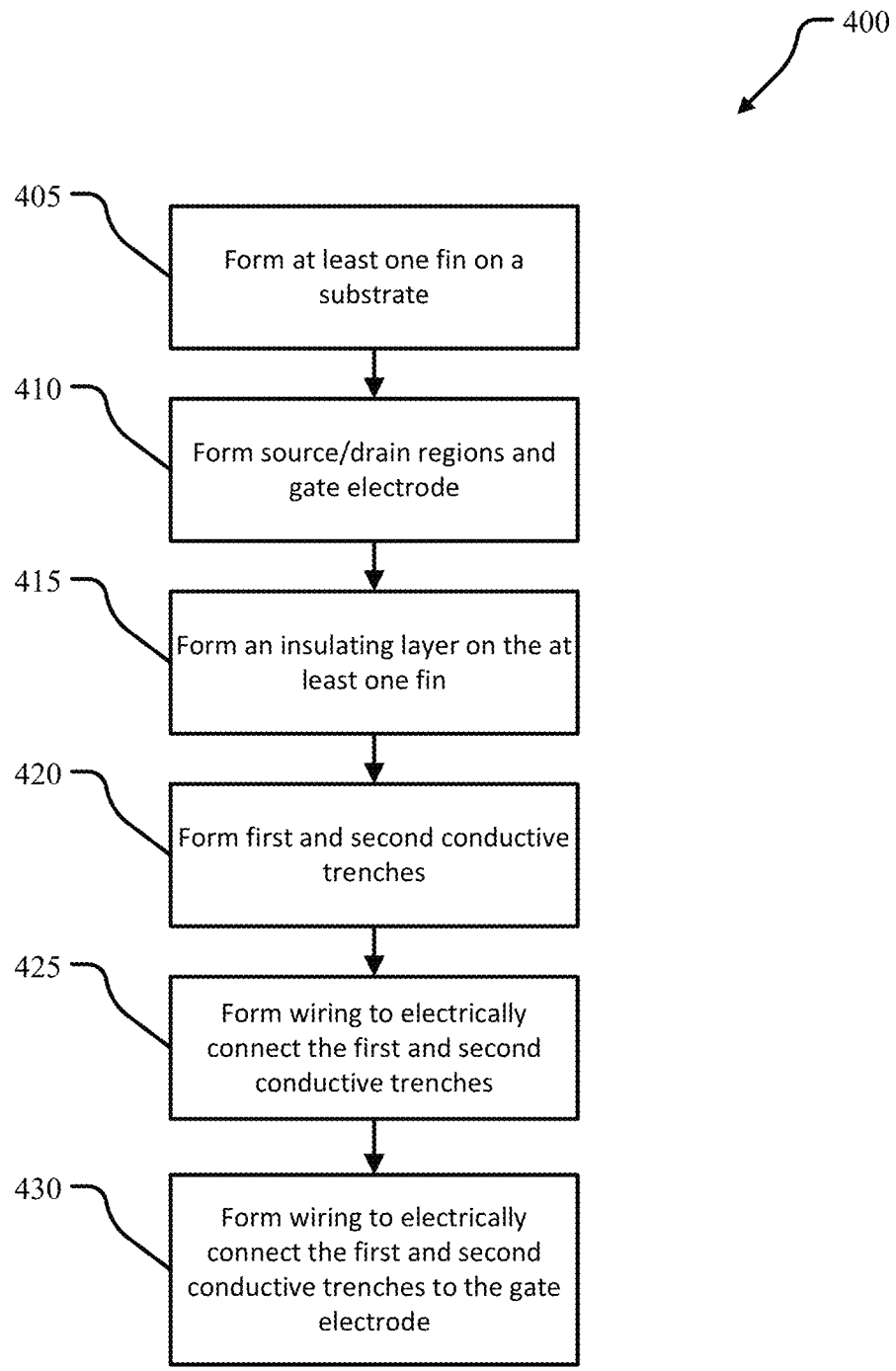
FIG. 4 illustrates a method of forming the transistor structure in FIGS. 1-3 according to at least one example embodiment.

FIG. 4 illustrates a method 400 of forming the transistor structure in FIGS. 1-3 according to at least one example embodiment.

While a general order for the steps of the method 400 is shown in FIG. 4, the method 400 can include more or fewer steps or can arrange the order of the steps differently than those shown in FIG. 4. Generally, the method 400 starts at operation 405 and ends at operation 430. Hereinafter, FIG. 4 shall be explained with reference FIGS. 1-3.

In operation 405, the method 400 includes forming a fin structure 110 on a substrate 105. Here, it should be understood that the substrate 105 may already include isolation regions 160/165 and well regions 170/175, all formed using known etching, deposition, and/or implantation techniques.

In operation 410, the method 400 includes forming source/drain regions and a gate electrode 125. For example, forming the source and drain regions may include forming regions 115 and 120 (e.g., via ion implantation of a desired impurity type) along with their respective electrodes 116 and 122 (and spacers 180).

In operation 415, the method 400 includes forming an insulating layer 130 on the fin structure 110.

In operation 420, the method 400 includes forming first and second conductive trenches 135/140 in the insulating layer 130 (e.g., according to FIG. 3).

In operation 425, the method 400 includes forming a wiring 145 to electrically connect the first and second conductive trenches 135/140 to one another. The wiring 145 may be formed on the insulating layer 130. Here, it should be appreciated that operation 425 may be omitted if desired. In other words, in at least one example embodiment, the transistor structure 100 does not include the wiring 145.

In operation 430, the method 400 includes forming one or more wirings (to 147/150/155) electrically connect the first and second conductive trenches 135/140 to the gate electrode 125.

In addition, it should be understood that specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:
1. A transistor structure, comprising:
   a substrate;
   a fin structure on the substrate and including an undoped portion, a first doped portion, and a second doped portion, the second doped portion being separated from the first doped portion by the undoped portion;
   an electrode on the fin structure between the first doped portion and the second doped portion;
   an insulating layer on the fin structure;

a first trench in the insulating layer at a first side of the fin structure and between the electrode and the second doped portion, the first trench including a first conductive material; and a second trench in the insulating layer at a second side of the fin structure and between the electrode and the second doped portion, the second side being opposite the first side, the second trench including a second conductive material.

2. The transistor structure of claim 1, wherein the first conductive material and the second conductive material are electrically connected to the electrode.

3. The transistor structure of claim 1, further comprising:
a first conductive layer, the first conductive layer electrically connecting the first conductive material to the second conductive material.

4. The transistor structure of claim 3, further comprising:
at least one second conductive layer electrically connecting the electrode to the first conductive layer.

5. The transistor structure of claim 4, wherein the first conductive material, the second conductive material, the first conductive layer, and the at least one second conductive layer include metal.

6. The transistor structure of claim 1, wherein the substrate further comprises:
a first isolation region; and
a second isolation region, wherein the first trench penetrates the first isolation region, and wherein the second trench penetrates the second isolation region.

7. The transistor structure of claim 1, wherein the electrode is closer to the first doped portion than the second doped portion.

8. The transistor structure of claim 7, wherein the electrode is on the undoped portion of the fin structure.

9. The transistor structure of claim 1, wherein the first doped portion and the second doped portion each include a raised portion on the fin structure.

10. The transistor structure of claim 1, wherein the fin structure is a plurality of fins including a first outer fin and a second outer fin, and wherein the first trench is at an outer side of the first outer fin, and wherein the second trench is at an outer side of the second outer fin.

11. A fin field-effect transistor (FinFET), comprising:
a substrate;
a fin structure on the substrate and including a source, a drain, and a portion that separates the source from the drain;
a gate electrode on the fin structure and between the source and the drain;
an insulating layer on the fin structure;
a first trench in the insulating layer at a first side of the fin structure and between the gate electrode and the drain, the first trench including a first metal; and
a second trench in the insulating layer at a second side of the fin structure and between the gate electrode and the drain, the second side being opposite the first side, the second trench including a second metal.

12. The FinFET of claim 11, further comprising:
a metal wiring, the metal wiring electrically connecting the first metal to the second metal.

13. The FinFET of claim 12, wherein the fin structure is a plurality of fins including a first outer fin and a second outer fin, and wherein the first trench is at an outer side of the first outer fin, and wherein the second trench is at an outer side of the second outer fin.

14. The FinFET of claim 12, wherein the fin structure extends in a first direction, and wherein the metal wiring extends in a second direction that is perpendicular to the first direction.

15. The FinFET of claim 14, wherein the substrate further comprises:
a first isolation region; and
a second isolation region, wherein the first trench including the first metal penetrates the first isolation region, and wherein the second trench including the second metal penetrates the second isolation region.

16. The FinFET of claim 11, further comprising:
a dummy electrode on the fin structure and between the gate electrode and the drain.

17. The FinFET of claim 16, wherein the gate electrode is closer to the source than the drain.

18. A transistor, comprising:
a substrate;
at least one epitaxial structure on the substrate and including a source, a drain, and a portion that separates the source from the drain, the at least one epitaxial structure being linear and extending in a first direction;
a gate electrode on the at least one epitaxial structure and between the source and the drain;
an insulating layer on the at least one epitaxial structure; and
a conductive structure electrically connected to the gate electrode and that straddles the at least one epitaxial structure at a location between the gate electrode and the drain.

19. The transistor of claim 18, wherein the conductive structure includes:
a first conductive trench at a first side of the at least one epitaxial structure; and
a second conductive trench at a second side of the at least one epitaxial structure the second side being opposite the first side.

20. The transistor of claim 19, wherein the conductive structure includes a conductive wiring that electrically connects the first conductive trench to the second conductive trench, the conductive wiring extending in a second direction that is perpendicular to the first direction.

* * * * *